United States Patent
Ma et al.

(10) Patent No.: US 10,867,540 B2
(45) Date of Patent: Dec. 15, 2020

(54) CIRCUIT BOARD, DRIVING DEVICE AND DISPLAY DEVICE

(71) Applicant: BOE TECHNOLOGY GROUP CO., LTD., Beijing (CN)

(72) Inventors: Yongda Ma, Beijing (CN); Yong Qiao, Beijing (CN); Jianbo Xian, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/474,134

(22) PCT Filed: Sep. 26, 2018

(86) PCT No.: PCT/CN2018/107446
§ 371 (c)(1),
(2) Date: Jun. 27, 2019

(87) PCT Pub. No.: WO2019/062730
PCT Pub. Date: Apr. 4, 2019

(65) Prior Publication Data
US 2020/0251035 A1    Aug. 6, 2020

(30) Foreign Application Priority Data
Sep. 27, 2017   (CN) .................. 2017 2 1248489 U

(51) Int. Cl.
*H05K 1/11*    (2006.01)
*H05K 1/14*    (2006.01)
*G09G 3/20*    (2006.01)

(52) U.S. Cl.
CPC ....... *G09G 3/20* (2013.01); *G09G 2300/0426* (2013.01); *G09G 2380/02* (2013.01)

(58) Field of Classification Search
CPC .............. G09G 3/20; G09G 2380/02; G09G 2300/0426
See application file for complete search history.

(56) References Cited

U.S. PATENT DOCUMENTS 8,541,690 B2 *   9/2013   Voraberger ........... H01L 23/498
                                                              174/260
9,640,499 B2 *   5/2017   Kwon .................... H01L 24/06
(Continued)

FOREIGN PATENT DOCUMENTS

CN         1781346 A       5/2006
CN       102293072 A      12/2011
(Continued)

OTHER PUBLICATIONS

Search Report and Written Opinion for International Application No. PCT/CN2018/107446 dated Jan. 7, 2019.

*Primary Examiner* — Yuriy Semenenko
(74) *Attorney, Agent, or Firm* — Calfee, Halter & Griswold LLP

(57) ABSTRACT

A circuit board comprising a first sub-circuit board, a second sub-circuit board, and a circuit connection structure. The first and second sub-circuit board having a first and second connection terminal, respectively. The circuit connection structure has a first port for mating with the first connection terminal, and a second port for mating with the second connection terminal. The first connection terminal, the second connection terminal, the first port, and the second port are configured such that when the first sub-circuit board is connected to the second sub-circuit board through the circuit connection structure, a first connection terminal end face faces the first port in a first direction, and a second connection terminal end face faces the second port in a second direction, and an angle between the first direction and the (Continued)

second direction is greater than 90° and less than or equal to 180°.

20 Claims, 3 Drawing Sheets

(56) References Cited

U.S. PATENT DOCUMENTS

| | | |
|---|---|---|
| 2006/0234521 A1 | 10/2006 | Uchida et al. |
| 2010/0300738 A1 | 12/2010 | Ito et al. |
| 2016/0147361 A1* | 5/2016 | Ahn .................. G06F 3/0416 |
| | | 345/173 |
| 2018/0366059 A1* | 12/2018 | Lee .................. G09G 3/3225 |
| 2019/0121207 A1* | 4/2019 | Xian ............... G02F 1/136213 |
| 2019/0150297 A1* | 5/2019 | Kim .................. H05K 1/189 |
| | | 345/30 |
| 2019/0206308 A1* | 7/2019 | Yoo .................. G06F 3/1423 |
| 2019/0279597 A1* | 9/2019 | Park .................. G09G 3/006 |
| 2019/0281700 A1* | 9/2019 | Pyun .................. H05K 1/118 |

FOREIGN PATENT DOCUMENTS

| | | |
|---|---|---|
| CN | 203707382 U | 7/2014 |
| CN | 207369413 U | 5/2018 |

* cited by examiner

CIRCUIT BOARD, DRIVING DEVICE AND DISPLAY DEVICE

RELATED APPLICATION

This application is the U.S. national stage entry of PCT International Application No. PCT/CN2018/107446, filed on Sep. 26, 2018, which claims the benefit of Chinese Patent Application No. 201721248489.X, filed on Sep. 27, 2017, the entire contents of which are incorporated herein by reference.

TECHNICAL FIELD

The present disclosure relates to the field of display technologies, and especially to a circuit board, a driving device and a display device.

BACKGROUND

A display device typically comprises a display panel and a driving device for driving the display panel to display images. The main component of the driving device comprises a circuit board, which may comprise a plurality of sub-circuit boards. In order to achieve signal transmission between the sub-circuit boards, a circuit connection structure is usually provided between the sub-circuit boards.

SUMMARY

A circuit board provided by an exemplary embodiment comprises a first sub-circuit board, a second sub-circuit board and a circuit connection structure, the first sub-circuit board being electrically connected to the second sub-circuit board through the circuit connection structure. The first sub-circuit board comprises a first connection terminal, the second sub-circuit board comprises a second connection terminal, the circuit connection structure comprises a first port configured to match with the first connection terminal and a second port configured to match with the second connection terminal. The first connection terminal, the second connection terminal, the first port, and the second port are configured such that when the first sub-circuit board is electrically connected to the second sub-circuit board through the circuit connection structure, a first connection terminal end face faces the first port in a first direction, and a second connection terminal end face faces the second port in a second direction. The first direction is perpendicular to a plane of the first connection terminal end face and points to the first port, the second direction is perpendicular to a plane of the second connection terminal end face and points to the second port, and an angle between the first direction and the second direction is greater than 90° and less than or equal to 180°.

In some exemplary embodiments, the plane of the first connection terminal end face is parallel to the plane of the second connection terminal end face in response to the first connection terminal being connected to the first port and the second connection terminal being connected to the second port.

In some exemplary embodiments, the angle between the first direction and the second direction is equal to 180°.

In some exemplary embodiments, the angle between the first direction and the second direction is greater than 135° and less than 180°.

In some exemplary embodiments, the circuit connection structure comprises at least two circuit wirings in parallel with each other, each of the first connection terminal and the second connection terminal comprises at least two sub-terminals, each of the circuit wirings is connected to at least one sub-terminal of the first connection terminal and at least one sub-terminal of the second connection terminal, respectively, wherein a spacing between two adjacent circuit wirings is greater than a width of a wider circuit wiring among the two adjacent circuit wirings and less than twice the width of the wider circuit wiring, a width direction of the circuit wirings is perpendicular to an extension direction of the circuit wirings.

In some exemplary embodiments, spacings between adjacent circuit wirings are identical.

In some exemplary embodiments, the circuit connection structure further comprises a flexible package layer for packaging the circuit wirings.

In some exemplary embodiments, the circuit board comprises a first connection buckle between the first port of the circuit connection structure and the first connection terminal of the first sub-circuit board, and a second connection buckle between the second port of the circuit connection structure and the second connection terminal, the first connection buckle is configured to fix the first port and the first connection terminal together, the second connection buckle is configured to fix the second port and the second connection terminal together.

In some exemplary embodiments, the first sub-circuit board and the second sub-circuit board are fixed to a mounting plate, the first connection terminal is electrically connected to a surface of the first sub-circuit board, the second connection terminal is electrically connected to a surface of the second sub-circuit board.

In some exemplary embodiments, the first connection terminal is provided with a first elastic piece for limiting the first port of the circuit connection structure, and the second connection terminal is provided with a second elastic piece for limiting the second port of the circuit connection structure, the first port of the circuit connection structure extends into the first connection terminal via the first elastic piece, the second port of the circuit connection structure extends into the second connection terminal via the second elastic piece.

In some exemplary embodiments, the first direction is parallel to an extending direction of circuit wirings in the first port of the circuit connection structure, and the second direction is parallel to an extending direction of circuit wirings in the second port of the circuit connection structure.

In some exemplary embodiments, an angle between a plane of a board surface of the first sub-circuit board and the plane of the first connection terminal end face is equal to 90°, an angle between a plane of a board surface of the second sub-circuit board and the plane of the second connection terminal end face is equal to 90°.

Another exemplary embodiment of the disclosure provides a driving device comprising the circuit board according to any one of foregoing embodiments.

Yet another exemplary embodiment of the disclosure provides a display device comprising the driving device according to the above exemplary embodiment.

BRIEF DESCRIPTION OF DRAWINGS

The drawings described herein are intended to provide a further understanding of the present disclosure, and constitute a part thereof. The schematic drawings of the present disclosure and description thereof are intended to illustrate exemplary embodiments and do not inappropriately limit the present disclosure. In the drawings.

DETAILED DESCRIPTION OF EMBODIMENTS

Figure 1:
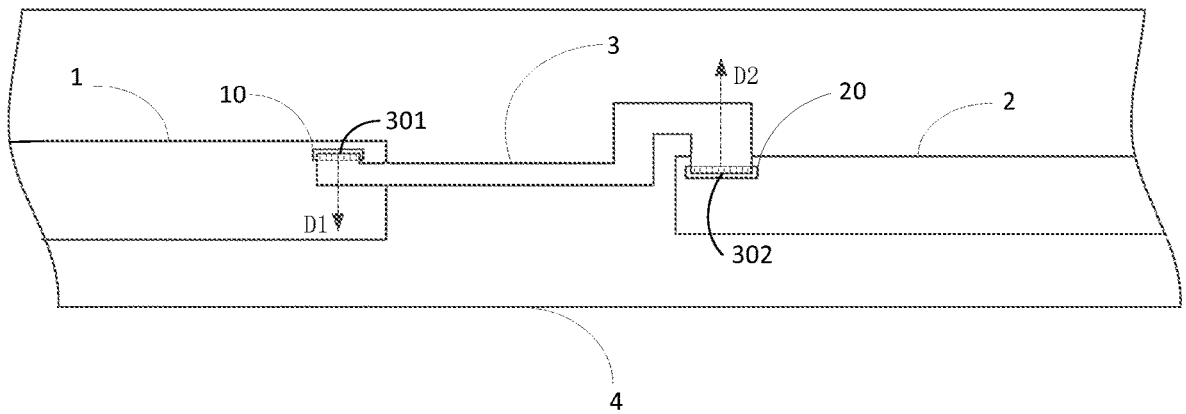
FIG. 1 is a structural view of a circuit board provided by an exemplary embodiment.

The technical solutions in exemplary embodiments of the disclosure will be clearly and completely described below in conjunction with the accompanying drawings. The described exemplary embodiments are only part of the embodiments based on the inventive concept revealed by the disclosure, and all possible embodiments that apply the above inventive concept are not exhaustively listed herein. All other embodiments obtained by those skilled in the art based on the exemplary embodiments herein without inventive efforts fall within the scope of the present application.

In practice, for a finished display device, even after passing a preliminary quality test, a malfunction phenomenon such as failure to display normally will still occur in subsequent steps or during user's usage. The inventors of what is disclosed in this application have found that a connection failure between sub-circuit boards of the circuit board of the driving device for the display device is one cause of the above-described malfunction phenomenon. Specifically, the display device may experience vibration or shaking during transportation or user's use, the vibration or shaking would cause an impact on connections between the sub-circuit boards, which may damage or destroy connections between the sub-circuit boards, such that signals cannot be transmitted smoothly or even are interrupted between the sub-circuit boards, causing the failure of normal display to the display device.

In the description below, at least the following reference numerals may be mentioned:

1—first sub-circuit board, 10—first connection terminal;
101—first connection buckle, 102—first elastic piece;
2—second sub-circuit board, 20—second connection terminal;
3—circuit connection structure, 301—first port of the circuit connection structure;
31—flexible package layer, 32—circuit wiring;
4—mounting plate.

As shown in FIG. 1, FIG. 3, FIG. 6 and FIG. 7, exemplary embodiments provide a circuit board comprising at least two sub-circuit boards electrically connected through a circuit connection structure 3, for example, a first sub-circuit board 1 and a second sub-circuit board 2. The first sub-circuit board 1 has a first connection terminal 10, and the second sub-circuit board 2 has a second connection terminal 20. The first connection terminal 10 is configured to match with a first port 301 of the circuit connection structure, and the second connection terminal 20 of the second sub-circuit board 2 is configured to match with a second port 302 of the circuit connection structure 3.

Figure 6:
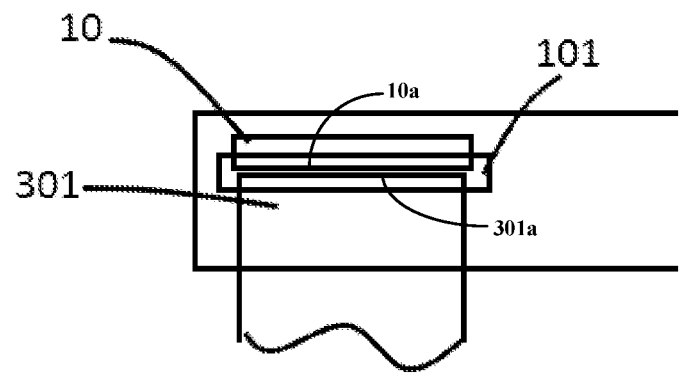
FIG. 6 is a schematic view showing connection between the first port of the circuit connection structure and the first connection terminal of the first sub-circuit board in another exemplary embodiment.
Figure 7:
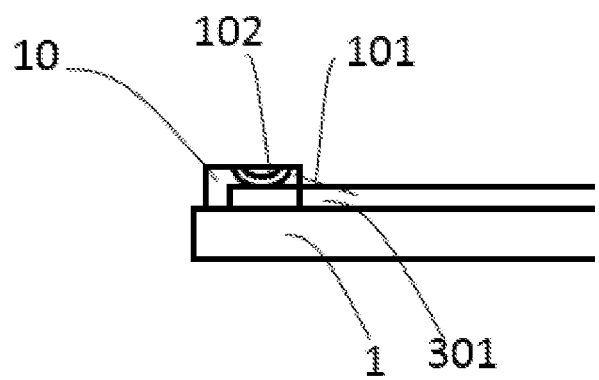
FIG. 7 is a sectional view showing connection between the first port of the circuit connection structure and the first connection terminal of the first sub-circuit board in a further exemplary embodiment.

To facilitate the description below, when the first sub-circuit board is connected with the circuit connection structure, an end face of the first connection terminal 10 opposite to the first port 301 of the circuit connection structure is referred to as a first connection terminal end face, and an end face of the first port 301 of the circuit connection structure opposite to the first connection terminal end face is referred to as a first port end face. When the second sub-circuit board is connected with the circuit connection structure, an end face of the second connection terminal 20 opposite to the second port 302 of the circuit connection structure is defined as a second connection terminal end face, and an end face of the second port 302 of the circuit connection structure 3 opposite to the second connection terminal end face is defined as a second port end face. For example, FIG. 6 schematically shows a first connection terminal end face 10a and a first port end face 301a.

In some exemplary embodiments, when the first connection terminal 10 mates with the first port 301 of the circuit connection structure, the first connection terminal end face 10a is in contact with the first port end face 301a, hence, in this case, the first connection terminal end face is parallel to the first port end face. Similarly, the second connection terminal end face is parallel to the second port end face.

According to an exemplary embodiment, the first connection terminal 10 of the first sub-circuit board 1, the second connection terminal 20 of the second sub-circuit board 2, and the first port 301 and the second port 302 of the circuit connection structure 3 are configured such that when the first sub-circuit board 1 is electrically connected to the second sub-circuit board 2 via the circuit connection structure 3, the first connection terminal end face 10a faces the first port 301 in a first direction, and the second connection terminal end face 20a faces the second port 302 in a second direction. The first direction is perpendicular to the plane of the first connection terminal end face 10a and points to the first port 301, and the second direction is perpendicular to the plane of the second connection terminal end face 20a and points to the second port 302. The angle between the first direction and the second direction is greater than 90° and less than or equal to 180°. For example, in FIG. 1 and FIG. 3, the first direction D1 and the second direction D2 are schematically shown by dashed lines with arrows.

Connections between the sub-circuit boards when the circuit board proposed by the exemplary embodiment is experiencing vibration or shaking under the effect of external factors will be discussed below by way of example.

Figure 3:
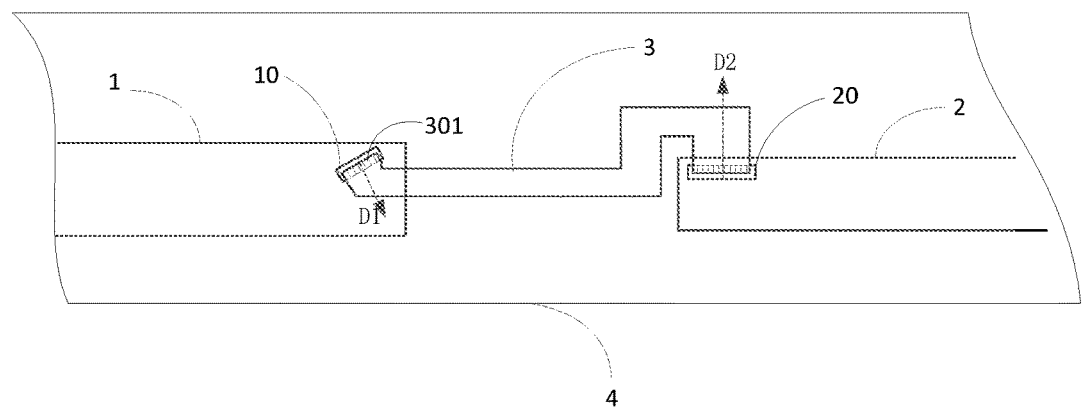
FIG. 3 is a structural view of a circuit board provided by another exemplary embodiment.

In an example, as shown in FIG. 1 and FIG. 3, assuming that the vibration of the circuit board ends with a movement along the second direction, at this time, the first connection terminal end face applies a first thrust F1 to the first port 301 of the circuit connection structure along a direction perpendicular to the first port end face of the circuit connection structure. Since the first connection terminal end face is parallel to the first port end face, the direction of the first thrust F1 is the same as the first direction. At the same time, the second connection terminal end face, due its own inertia, applies an inertial force to the second port end face of the circuit connection structure 3 in a direction perpendicular to the second port end face of the circuit connection structure 3, and the inertial force herein is referred to as a second thrust F2. Since the second connection terminal end face is parallel to the second port end face, the direction of the second thrust F2 is the same as the second direction.

In this way, for the example of the circuit board as shown in FIG. 1 or FIG. 3, when the vibration of the circuit board ends with movement along the second direction, the second port 302 of the circuit connection structure 3 tends to detach from the second connection terminal 20, and the first port 301 of the circuit connection structure tends to be more tightly connected to the first connection terminal 10. As described above, the angle between the first direction and the second direction is greater than 90° and less than or equal to 180°, so the angle between the first thrust F1 and the second thrust F2 is also greater than 90° and less than or equal to 180°. At this time, if the second port end face is taken as the horizontal plane and the direction perpendicular to the second port end face is taken as the vertical direction, it can be found by performing force analysis for the second port of the circuit connection structure 3 that the direction of a component force of the first thrust F1 in the vertical direction is opposite to the direction of the second thrust F2, that is, the component force of the first thrust F1 in the vertical direction can offset or weaken the second thrust F2 to some extent, thereby decreasing the tendency of the second port 302 of the circuit connection structure 3 to detach from the second connection terminal 20.

Similarly, for the example shown in FIG. 1 or FIG. 3, when the vibration of the circuit board provided by exemplary embodiments ends with movement along the first direction, the second connection terminal end face applies a second thrust F2 to the second port 302 of the circuit connection structure along a direction perpendicular to the second port end face of the circuit connection structure, and the direction of the second thrust F2 is the same as the second direction. At the same time, the first connection terminal end face applies the first thrust F1 to the first port end face of the circuit connection structure 3 along a direction perpendicular to the first port end face of the circuit connection structure 3, and the direction of the first thrust F1 is the same as the first direction. At this time, the angle between the first thrust F1 and the second thrust F2 is still greater than 90° and less than or equal to 180°, but the first port 301 of the circuit connection structure tends to detach from the first connection terminal 10, and the second port of the circuit connection structure tends to be more tightly connected to the second connection terminal 20. At this time, if the first port end face is taken as the horizontal plane and the direction perpendicular to the first port end face is taken as the vertical direction, it can be found by performing force analysis for the first port 301 of the circuit connection structure that the direction of a component force of the second thrust F2 in the vertical direction is opposite to the direction of the first thrust F1, that is, the component force of the second thrust in the vertical direction can offset or weaken the first thrust to some extent, thereby decreasing the tendency of the first port 301 of the circuit connection structure to detach from the first connection terminal 10.

Through the above analysis, it can be understood that, in case the circuit board provided by the exemplary embodiment is applied to a display device, when the display device is experiencing vibration, the probability of a connection line in the circuit connection structure in the circuit board detaching from a connection terminal of a sub-circuit board is decreased, so that the probability of failure of the display device can be decreased.

In some exemplary embodiments, as shown in FIG. 1 and FIG. 3, the first connection terminal 10 is electrically connected to a surface of the first sub-circuit board, and the second connection terminal 20 is electrically connected to a surface of the second sub-circuit board 2. For example, the first connection terminal 10 is soldered to the board surface of the first sub-circuit board 1, and the second connection terminal 20 is soldered to the board surface of the second sub-circuit board 2. The angle between the plane of the first connection terminal end face and the plane of the board surface of the first sub-circuit board 1, and the angle between the plane of the second connection terminal end face and the plane of the board surface of the second sub-circuit board 2 may be set as needed. In some exemplary embodiments, in order to enable the first connection terminal 10 to mate with the first port 301 of the circuit connection structure easily, the angle between the plane of the board surface of the first sub-circuit board 1 and the plane of the first connection terminal end face is equal to 0°, and the angle between the plane of the board surface of the second sub-circuit board 2 and the plane of the second connection terminal end face is equal to 0°.

FIG. 1 illustrates a circuit board according to an exemplary embodiment, in which the plane of the first connection terminal end face is parallel to the plane of the second connection terminal end face, and the first direction is opposite to the second direction. At this time, the angle formed between the first direction and the second direction is equal to 180°.

Generally, the display device is typically placed vertically on a placement surface, that is, the plane of the display surface of the display device is perpendicular to the placement surface for the display device. In this case, the board surface of each sub-circuit board in the circuit board of the display device is also perpendicular to the placement surface for the display device. When the circuit board provided by the embodiment shown in FIG. 1 is applied to a display device, at the moment when the vibration of the display device ends, the circuit connection structure 3 still tends to move towards the first direction D1 or the second direction D2 shown in FIG. 1 due to its inertia, although the first sub-circuit board 1 and the second sub-circuit board 1 stop movement.

For example, at the moment when the vibration of the circuit board shown in FIG. 1 ends with movement along the first direction, the first sub-circuit board 1 is no longer moving, but the first port 301 of the circuit connection structure still has inertia of moving downwards (towards the first direction). The inertia can be regarded as the first thrust F1 applied by the first connection terminal end face of the first sub-circuit board 1 to the first port 301 of the circuit connection structure during the downward movement (the first direction), so that the first port 301 of the circuit connection structure tends to detach from the first connection terminal 10. At that time, the second sub-circuit board 2 is also no longer moving, but the second port of the circuit connection structure 3 still has inertia of moving along the first direction, so that the second port of the circuit connection structure 3 tends to be more tightly connected to the second connection terminal 20. However, since the end face of the second connection terminal 20 of the second sub-circuit board 2 faces the second port of the circuit connection structure 3, the second connection terminal end face of the second sub-circuit board 2 has a reaction force on the second port of the circuit connection structure 3, which is the second thrust F2 mentioned above.

Figure 2:
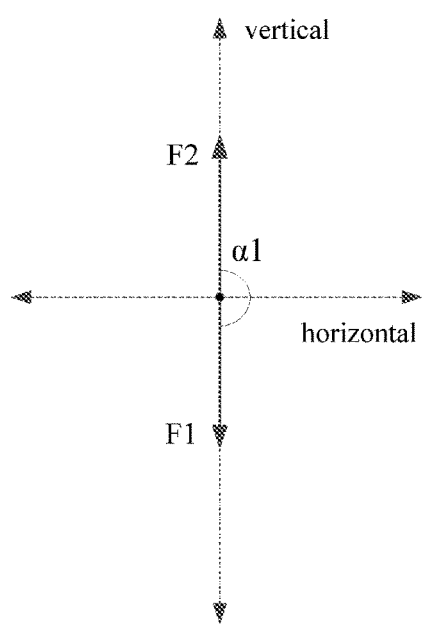
FIG. 2 is a force analysis diagram for the first port of the circuit connection structure in FIG. 1.

FIG. 2 is a schematic view illustrating force analysis of the first port 301 of the circuit connection structure under the above circumstances. Taking the first port end face as the horizontal plane and the direction perpendicular to the first port end face as the vertical direction, force analysis is performed for the first port 301 of the circuit connection structure. Since the angle between the first direction and the second direction is 180°, the second thrust F2 has no component force in the horizontal plane where the first port end face is situated, that is, the second thrust F2 all acts on the vertical direction perpendicular to the first port end face, so that the acting effect of the first thrust F1 is minimized, decreasing the tendency of the first port of the circuit connection structure to detach from the first connection terminal. Moreover, the second thrust F2 has no component force in the horizontal direction of the first port end face, so that the first port end face will not move relative to the first connection terminal end face, which prevents the connection between the first connection terminal 10 and the first port 301 from being damaged or interrupted by the relative movement between the first port end face and the first connection terminal end face.

FIG. 3 illustrates a circuit board according to another exemplary embodiment, in which the angle between the first direction and the second direction is greater than 90° and less than 180°.

If the circuit board shown in this exemplary embodiment is applied to a display device, the display device is placed vertically on a placement surface. In this case, at the moment when the vibration of the display device ends, though the first sub-circuit board 1 and the second sub-circuit board 2 have stopped moving, the circuit connection structure 3 still tends to move upwards (towards the second direction D2) or move downwards (towards the direction opposite to the second direction D2) due to its inertia.

Figure 4:
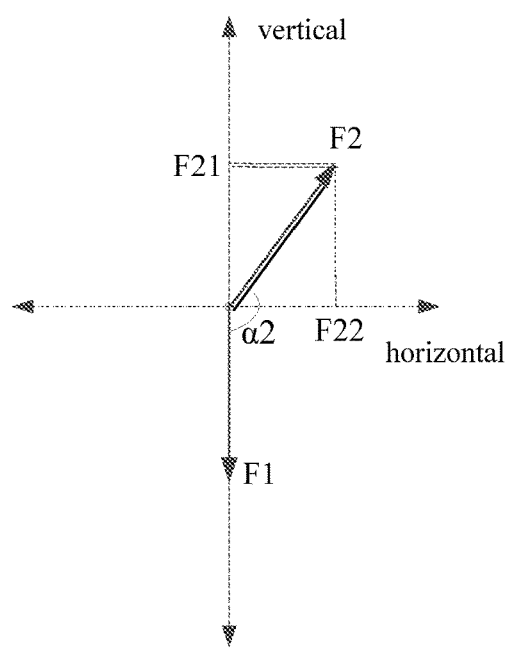
FIG. 4 is a force analysis diagram for the first port of the circuit connection structure in FIG. 3.

For example, as shown in FIG. 3 and FIG. 4, after the vibration of the display device has ended, the circuit connection structure 3 still tends to move downwards (towards the direction opposite to the second direction D2). For the first port 301 of the circuit connection structure, the first port 301 of the circuit connection structure still tends to move towards the first direction due to its inertia, which may be regarded as the first connection terminal end face of the first sub-circuit board 1 applying the first thrust F1 to the first port 301 of the circuit connection structure during the downward movement, so that the first port 301 of the circuit connection structure has a tendency to detach from the first connection terminal 10.

For the second port of the circuit connection structure 3, the second port of the circuit connection structure 3 still tends to move downwards (towards the direction opposite to the second direction) due to its inertia, so that the second port of the circuit connection structure 3 has a tendency to be more tightly connected to the second connection terminal 20. However, since the end face of the second connection terminal 20 faces the second port of the circuit connection structure 3, the second connection terminal end face has a reaction force on the second port of the circuit connection structure 3. The reaction force is referred to as a second thrust F2 and the direction of the second thrust F2 is consistent with the second direction.

As shown in FIG. 4, taking the first port end face as the horizontal plane and the direction perpendicular to the first port end face as the vertical direction, force analysis is performed for the first port 301 of the circuit connection structure. The direction of the first thrust F1 received by the first port is the same as the first direction, and the direction of the second thrust F2 is the same as the second direction. As described above, in the exemplary embodiment of FIG. 3, the angle between the first direction and the second direction is greater than 90° and less than 180°, so the angle between the second thrust F2 and the first thrust F1 is greater than 90° and less than 180°, which is represented by $\alpha 2$. At this time, the is component force F21 of the second thrust F2 in the vertical direction is $F21=F2 \cos(180°-\alpha 2)$, so that the first thrust force F1 is reduced, thereby decreasing the tendency of the first port 301 of the circuit connection structure to detach from the first connection terminal 10.

For the exemplary embodiment shown in FIG. 3, the horizontal component force of the second thrust F2 in the case of taking the first port end face as the horizontal plane is: $F22=F2 \sin(180°-\alpha 2)$. In order to reduce the horizontal component force of the second thrust F2 on the first port end face, in an embodiment, $\alpha 2$ is defined to be greater than 135° and less than 180°, and within this angular range, F21>F22. This can reduce the horizontal component force F21 of the second thrust F2 to thereby mitigate the unfavorable effect of the horizontal component force F21 on the connection between the first connection terminal 10 and the first port, and increase the component force of the second thrust F2 in the vertical direction to more reduce the first thrust F1.

Based on the same principle, force analysis for the second port of the circuit connection structure 3 at the moment when the vibration of the circuit board ends can be performed based on the exemplary embodiments of FIG. 1 and FIG. 3. It can be understood that the tendency of the second port of the circuit connection structure 3 to be tightly connected to the second connection terminal 20 is decreased, but in general, the second port of the circuit connection structure 3 still tends to be connected to the second connection terminal 20, in other words, the second port of the circuit connection structure 3 less tends to detach from the second connection terminal 20.

In some exemplary embodiments, when the first port 301 of the circuit connection structure mates with the first connection terminal 10, the extending direction of the circuit wirings in the first port 301 of the circuit connection structure is perpendicular to the plane of the first connection terminal end face, and the first direction is perpendicular to the plane of the first connection terminal end face. Therefore, when the first port 301 of the circuit connection structure mates with the first connection terminal 10, the first direction is parallel to the extending direction of the circuit wirings within the first port 301 of the circuit connection structure. Similarly, when the second port of the circuit connection structure 3 mates with the second connection terminal 20, the second direction is parallel to the extending direction of the circuit wirings within the second port of the circuit connection structure 3.

In some exemplary embodiments, in the case where the angle between the first direction and the second direction is greater than 90° and less than or equal to 180°, the angle between the plane of the board surface of the first sub-circuit board 1 and the first direction is greater than 0° and less than or equal to 90°, and the angle between the plane of the board surface of the second sub-circuit board 2 and the second direction is greater than 0° and less than or equal to 90°.

In some exemplary embodiments, as shown in FIG. 1 and FIG. 2, the sub-circuit boards are fixed to a mounting plate 4 to ensure the stability of the sub-circuit boards. In addition, in a further exemplary embodiment, as shown in FIG. 6, a first connection buckle 101 is disposed between the first port 301 of the circuit connection structure and the first connection terminal 10 of the first sub-circuit board, and the first port 301 of the circuit connection structure and the first connection terminal 10 are fixed together by the first connection buckle 101 to improve tightness of the connection between the first port 301 of the circuit connection structure and the first connection terminal 10. Further, in an example of FIG. 7, the first connection terminal 10 is provided with a first elastic piece 102 for limiting the first port 30 of the circuit connection structure, so that the first port 301 of the circuit connection structure extends into the first connection terminal 10 via the first elastic piece 102, thereby preventing looseness or detachment of the first port in the first connection terminal 10.

Similarly, in some exemplary embodiments, a second connection buckle is provided between the second port of the circuit connection structure 3 and the second connection terminal 20, and the second port of the circuit connection structure 3 and the second connection terminal 20 are fixed together by the second connection buckle to improve tightness of the connection between the second port 301 of the circuit connection structure and the second connection terminal 20. The second connection terminal is provided with a second elastic piece for limiting the second port of the circuit connection structure 3, so that the second port of the circuit connection structure extends into the second connection terminal of the second sub-circuit board via the second elastic piece, thereby preventing looseness or detachment of the second port in the second connection terminal.

In the exemplary embodiments, the circuit connection structure 3 can be implemented in various ways. For example, the circuit connection structure 3 may be a flexible circuit board. Of course, other forms of circuit connection structures are also possible, as long as the first sub-circuit board 1 and the second sub-circuit board 2 can be electrically connected so that signals can be transmitted.

Figure 5:
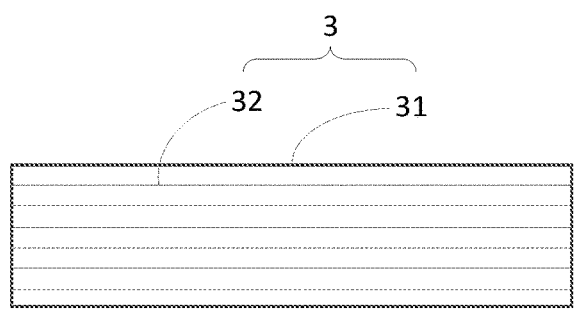
FIG. 5 is a structural view of a circuit connection structure according to an exemplary embodiment.

In some exemplary embodiments, as shown in FIG. 5, the circuit connection structure 3 comprises at least two circuit wirings 32 disposed in parallel. Correspondingly, the connection terminal of each sub-circuit board comprises at least two sub-terminals which are in one-to-one correspondence with the circuit wirings 32 to ensure that each of the circuit wirings 32 is connected to a corresponding sub-terminal. In other embodiments, a plurality of sub-terminals of the connection terminal of each sub-circuit board are connected to a circuit wiring, respectively.

In some exemplary embodiments, the spacing between two adjacent circuit wirings 32 is greater than the width of a wider circuit wiring among the two circuit wirings 32, and less than twice the width of the wider circuit wiring 32. The width direction of each circuit wiring 32 is perpendicular to the direction in which the circuit wiring 32 extends. Experimental tests have shown that in this case, it is possible to minimize signal interference between adjacent circuit wirings while ensuring that the number of circuit wirings is maximized.

In some exemplary embodiments, the spacings between two adjacent circuit wirings 32 are the same or similar, so that when the circuit board is experiencing vibration, the circuit connection structure 3 can uniformly transmit the force received by itself so as to prevent the port of the circuit connection structure 3 from being damaged by stress due to non-uniform thrust propagation.

In a further exemplary embodiment, as shown in FIG. 5, the circuit connection structure 3 further comprises a flexible package layer 31 for packaging a plurality of circuit wirings 32. The edges of the flexible package layer 31 extend in the same direction as the circuit wirings, which allows the flexible package layer 31 to package the circuit wirings 32 as many as possible.

In the description of the various embodiments above, specific features, structures, material, or characteristics may be combined in any suitable manner in any one or more embodiments or examples.

What have been described above are only some embodiments of the present disclosure, but the protection scope of the present application is not so limited. Any skilled person familiar with this technical field can readily conceive of variations or substitutions within the technical scope revealed by the present disclosure, and these variations or substitutions should be encompassed in the protection scope of the application. Thus, the scope of the present application should be based on the scope of the claims.

The invention claimed is:

1. A circuit board comprising a first sub-circuit board, a second sub-circuit board and a circuit connection structure, the first sub-circuit board being electrically connected to the second sub-circuit board through the circuit connection structure,
   wherein the first sub-circuit board comprises a first connection terminal, the second sub-circuit board comprises a second connection terminal, the circuit connection structure comprises a first port configured to match with the first connection terminal and a second port configured to match with the second connection terminal,
   wherein the first connection terminal, the second connection terminal, the first port, and the second port are configured such that when the first sub-circuit board is electrically connected to the second sub-circuit board through the circuit connection structure, a first connection terminal end face faces the first port in a first direction, and a second connection terminal end face faces the second port in a second direction,
   wherein the first direction is perpendicular to a plane of the first connection terminal end face and points to the first port, the second direction is perpendicular to a plane of the second connection terminal end face and points to the second port, wherein an angle between the first direction and the second direction is greater than 90° and less than or equal to 180°.

2. The circuit board according to claim 1, wherein the plane of the first connection terminal end face is parallel to the plane of the second connection terminal end face in response to the first connection terminal being connected to the first port and the second connection terminal being connected to the second port.

3. The circuit board according to claim 2, wherein the angle between the first direction and the second direction is equal to 180°.

4. The circuit board according to claim 1, wherein the angle between the first direction and the second direction is greater than 135° and less than 180°.

5. The circuit board according to claim 1, wherein the circuit connection structure comprises at least two circuit wirings in parallel with each other, each of the first connection terminal and the second connection terminal comprises at least two sub-terminals, each of the circuit wirings is connected to at least one sub-terminal of the first connection terminal and at least one sub-terminal of the second connection terminal, respectively, wherein a spacing between two adjacent circuit wirings is greater than a width of a wider circuit wiring among the two adjacent circuit wirings and less than twice the width of the wider circuit wiring, a width direction of the circuit wirings is perpendicular to an extension direction of the circuit wirings.

6. The circuit board according to claim 5, wherein spacings between adjacent circuit wirings are identical.

7. The circuit board according to claim 5, wherein the circuit connection structure further comprises a flexible package layer for packaging the circuit wirings.

8. The circuit board according to claim 1, wherein the circuit board comprises a first connection buckle between the first port of the circuit connection structure and the first connection terminal of the first sub-circuit board, and a second connection buckle between the second port of the circuit connection structure and the second connection terminal, the first connection buckle is configured to fix the first port and the first connection terminal together, the second connection buckle is configured to fix the second port and the second connection terminal together.

9. The circuit board according to claim 1, wherein the first sub-circuit board and the second sub-circuit board are fixed to a mounting plate, the first connection terminal is electrically connected to a surface of the first sub-circuit board, the second connection terminal is electrically connected to a surface of the second sub-circuit board.

10. The circuit board according to claim 1, wherein the first connection terminal is provided with a first elastic piece for limiting the first port of the circuit connection structure, and the second connection terminal is provided with a second elastic piece for limiting the second port of the circuit connection structure, the first port of the circuit connection structure extends into the first connection terminal via the first elastic piece, the second port of the circuit connection structure extends into the second connection terminal via the second elastic piece.

11. The circuit board according to claim 1, wherein the first direction is parallel to an extending direction of circuit wirings in the first port of the circuit connection structure, and the second direction is parallel to an extending direction of circuit wirings in the second port of the circuit connection structure.

12. The circuit board according to claim 1, wherein an angle between a plane of a board surface of the first sub-circuit board and the plane of the first connection terminal end face is equal to 90°, an angle between a plane of a board surface of the second sub-circuit board and the plane of the second connection terminal end face is equal to 90°.

13. A driving device comprising the circuit board according to claim 1.

14. A display device comprising the driving device according to claim 11.

15. The display device according to claim 14, wherein the plane of the first connection terminal end face is parallel to the plane of the second connection terminal end face in response to the first connection terminal being connected to the first port and the second connection terminal being connected to the second port.

16. The display device according to claim 15 wherein the angle between the first direction and the second direction is equal to 180°.

17. The display device according to claim 14, wherein the angle between the first direction and the second direction is greater than 135° and less than 180°.

18. The display device according to claim 14, wherein the circuit connection structure comprises at least two circuit wirings in parallel with each other, each of the first connection terminal and the second connection terminal comprises at least two sub-terminals, each of the circuit wirings is connected to at least one sub-terminal of the first connection terminal and at least one sub-terminal of the second connection terminal, respectively, wherein a spacing between two adjacent circuit wirings is greater than a width of a wider circuit wiring among the two adjacent circuit wirings and less than twice the width of the wider circuit wiring, a width direction of the circuit wirings is perpendicular to an extension direction of the circuit wirings.

19. The display device according to claim 18, wherein spacings between adjacent circuit wirings are identical.

20. The display device according to claim 18, wherein the circuit connection structure further comprises a flexible package layer for packaging the circuit wirings.

\* \* \* \* \*